United States Patent
Kim et al.

(10) Patent No.: US 9,806,295 B2
(45) Date of Patent: Oct. 31, 2017

(54) DISPLAY PANEL AND ORGANIC LIGHT EMITTING DISPLAY DEVICE

(71) Applicant: SAMSUNG DISPLAY CO., LTD., Yongin, Gyeonggi-Do (KR)

(72) Inventors: Joon-Youp Kim, Seoul (KR); Jin-Koo Chung, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 45 days.

(21) Appl. No.: 14/722,014

(22) Filed: May 26, 2015

(65) Prior Publication Data
US 2016/0155789 A1 Jun. 2, 2016

(30) Foreign Application Priority Data
Nov. 28, 2014 (KR) ................. 10-2014-0168257

(51) Int. Cl.
*H01L 51/52* (2006.01)
*H01L 27/32* (2006.01)

(52) U.S. Cl.
CPC ........ *H01L 51/5271* (2013.01); *H01L 27/326* (2013.01); *H01L 27/3272* (2013.01); *H01L 51/5281* (2013.01)

(58) Field of Classification Search
CPC ............. H01L 51/5271; H01L 51/5281; H01L 27/3272; H01L 27/326
See application file for complete search history.

(56) References Cited

U.S. PATENT DOCUMENTS

| | | | |
|---|---|---|---|
| 2007/0090754 A1* | 4/2007 | Li | H01L 51/5284 313/506 |
| 2007/0210703 A1* | 9/2007 | Izzanni | H01L 27/322 313/504 |
| 2010/0104958 A1* | 4/2010 | Jeong | C09B 47/26 430/7 |
| 2010/0201609 A1* | 8/2010 | Kim | H01L 51/5259 345/76 |
| 2011/0042697 A1* | 2/2011 | Lee | H01L 27/322 257/89 |
| 2014/0329950 A1* | 11/2014 | Shimoguchi | C08G 18/42 524/403 |

FOREIGN PATENT DOCUMENTS

| KR | 10-2005-0099236 A | 10/2005 |
|---|---|---|
| KR | 10-2008-0086507 A | 9/2008 |
| KR | 10-2009-0099744 A | 9/2009 |
| KR | 10-2009-0108385 A | 10/2009 |

* cited by examiner

*Primary Examiner* — Kyoung Lee
*Assistant Examiner* — Christina Sylvia
(74) *Attorney, Agent, or Firm* — Lewis Roca Rothgerber Christie LLP

(57) ABSTRACT

A display panel includes a substrate including a plurality of pixel regions having sub-pixel regions and a reflective region surrounding the sub-pixel regions, light emitting structures in the pixel regions, the light emitting structures being on the substrate, an encapsulation substrate over the light emitting structures, a reflective member on a lower surface of the encapsulation substrate, the reflective member having openings, each of the openings being located at a corresponding one of the sub-pixel regions, and a light blocking member on an upper surface of the encapsulation substrate, the light blocking member partially blocking a light of a first wavelength.

13 Claims, 11 Drawing Sheets

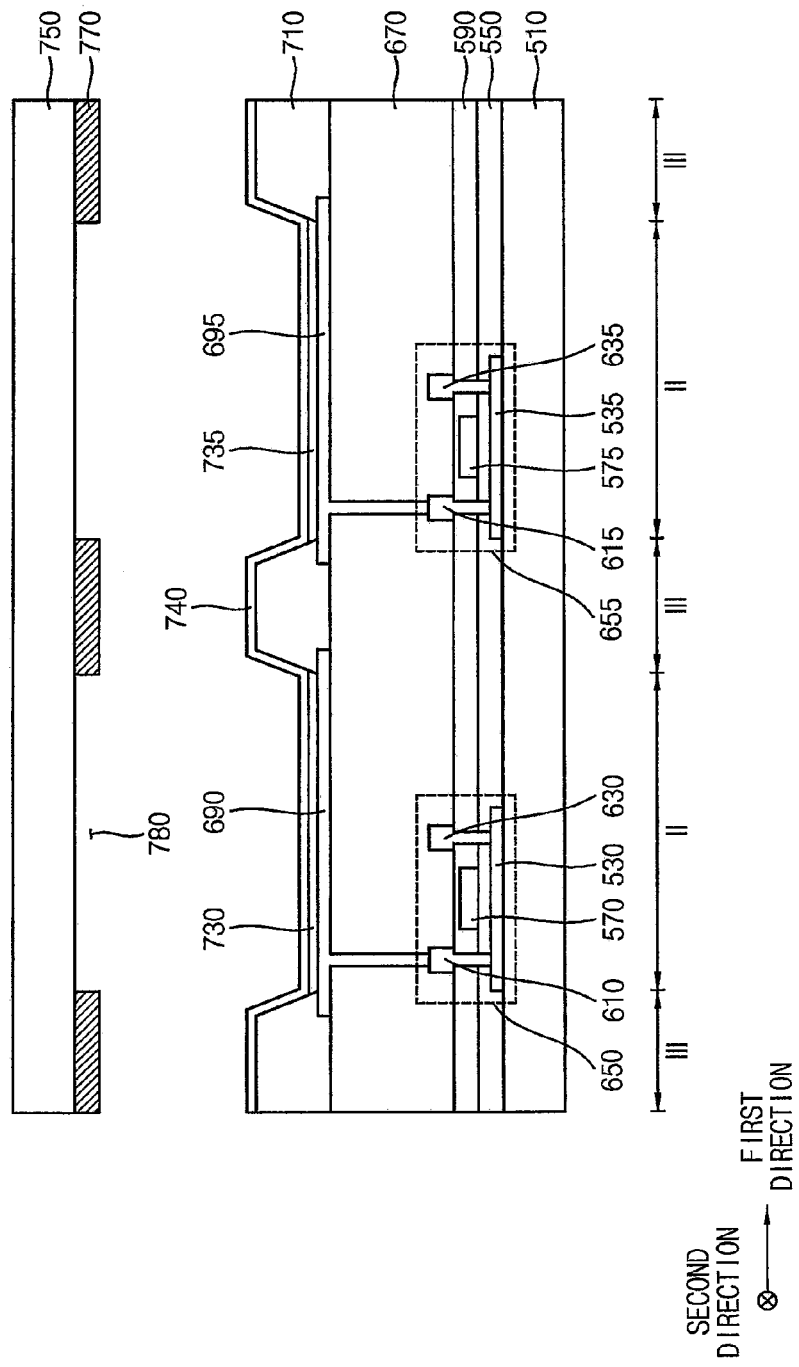

DISPLAY PANEL AND ORGANIC LIGHT EMITTING DISPLAY DEVICE

CROSS-REFERENCE TO RELATED APPLICATION

This application claims priority to and the benefit of Korean Patent Applications No. 10-2014-0168257, filed on Nov. 28, 2014 in the Korean Intellectual Property Office (KIPO), the contents of which are incorporated herein in their entirety by reference.

BACKGROUND

1. Field

Example embodiments relate generally to display panels and an organic light emitting display device.

2. Description of the Related Art

A flat panel display (FPD) device is widely used as a display device of an electronic device because the FPD device is lightweight and thin as compared to a cathode-ray tube (CRT) display device. Typical examples of the FPD device are a liquid crystal display (LCD) device and an organic light emitting display (OLED) device. As compared to the LCD device, the OLED device has many features such as a higher luminance and a wider viewing angle. In addition, the OLED device can be made thinner because the OLED device does not require a backlight. In the OLED device, electrons and holes are injected into an organic thin layer through a cathode and an anode, respectively, and then recombined in the organic thin layer to generate excitons, thereby emitting light of a certain wavelength.

A mirror OLED device capable of reflecting an image of an object (or target) that is located in front of the OLED device by including a reflective region and a pixel region has been recently developed. In this case, the mirror OLED device may not express various reflective colors because a material (e.g., a metal) having high reflectivity is used as a reflective member. In addition, since ultraviolet rays are penetrated in the mirror OLED device, an OLED element may be easily deteriorated.

SUMMARY

Some example embodiments provide a display panel including a reflective member and a light blocking member.

Some example embodiments provide an organic light emitting display device including a reflective member and a light blocking member.

According to one aspect of example embodiments, a display panel includes a substrate including a plurality of pixel regions having sub pixel regions and a reflective region surrounding the sub-pixel regions, light emitting structures in the pixel regions, the light emitting structures being on the substrate, an encapsulation substrate over the light emitting structures, a reflective member on a lower surface of the encapsulation substrate, the reflective member including openings, each of the openings being located at a corresponding one of the sub-pixel regions, and a light blocking member on an upper surface of the encapsulation substrate, the light blocking member partially blocking a light of a first wavelength.

In example embodiments, the light blocking member may block ultraviolet rays and may partially block visible light of the first wavelength.

In example embodiments, the light blocking member includes a first portion located in the sub-pixel region and a second portion located in the reflective region.

In example embodiments, the first portion of the light blocking member may block ultraviolet rays.

In example embodiments, the second portion of the light blocking member blocks ultraviolet rays and may partially block visible light of the first wavelength.

In example embodiments, the first portion may include a material that blocks ultraviolet rays.

In example embodiments, the second portion may include at least one selected from a material, a pigment, or a dye that blocks ultraviolet rays.

In example embodiments, the first portion may be transparent, and the second portion may have a first color.

In example embodiments, the first portion of the light blocking member may block ultraviolet rays.

In example embodiments, the second portion of the light blocking member may partially block visible light of the first wavelength.

In example embodiments, the first portion may include a material that blocks ultraviolet rays.

In example embodiments, the second portion may include at least one selected from a pigment or a dye.

In example embodiments, the first and second portions may block ultraviolet rays, and may partially block visible light of the first wavelength.

In example embodiments, the first and second portions may include at least one selected from a material, a pigment, or a dye that blocks ultraviolet rays.

In example embodiments, the first and second portions may have a first color.

In example embodiments, each of the light emitting structures may include at least one semiconductor element on the substrate, a lower electrode on the semiconductor element, the lower electrode electrically connecting the semiconductor element, a light emitting layer on the lower electrode, and an upper electrode on the light emitting layer.

According to another aspect of example embodiments, a display panel includes a substrate including a plurality of pixel regions having sub-pixel regions and a reflective region surrounding the sub-pixel regions, light emitting structures in the pixel regions, the light emitting structures being on the substrate, an encapsulation substrate over the light emitting structures, a reflective member on a lower surface of the encapsulation substrate, the reflective member including first openings, each of the first openings being located at a corresponding one of the sub-pixel regions, and a transparent member between the encapsulation substrate and the reflective member, the transparent member having a second opening that overlaps with the first opening, and the transparent member having a first color.

In example embodiments, the first opening and the second opening may have the same size.

In example embodiments, the display panel may further include a light blocking member on an upper surface of the encapsulation substrate, the light blocking member partially blocking light of a first wavelength.

In example embodiments, the light blocking member may block ultraviolet rays, and the light blocking member may be transparent.

According to an aspect of example embodiments, an organic light emitting display device includes a display panel including a substrate including a plurality of pixel regions having sub-pixel regions and a reflective region surrounding the sub-pixel regions, light emitting structures in the pixel regions, the light emitting structures being on the substrate, an encapsulation substrate over the light emitting structures, a reflective member on a lower surface of the encapsulation substrate and including openings, each of the openings being located at a corresponding one of the sub-pixel regions, a body surrounding the display panel, and a light blocking member on the display panel and the body, wherein the light blocking member protects the display panel and partially blocks a light of a first wavelength.

In example embodiments, the light blocking member may partially block ultraviolet rays and may partially block visible light of the first wavelength.

In example embodiments, the light blocking member may include at least one selected from a material, a pigment, or a dye that blocks ultraviolet rays, and the light blocking member may have a first color.

In example embodiments, the light blocking member may include a glass or a plastic.

As a display panel according to example embodiments includes a reflective member and a light blocking member, the display panel may display various reflective colors and may have various applications. In addition, deterioration of a light emitting structure may be reduced by blocking ultraviolet rays penetrated in the display panel.

As an organic light emitting display device according to example embodiments includes a reflective member and a light blocking member, the organic light emitting display device may display various reflective colors and may have various applications. In addition, deterioration of a light emitting structure may be reduced by blocking ultraviolet rays penetrated in the organic light emitting display device.

BRIEF DESCRIPTION OF THE DRAWINGS

Example embodiments of the present invention can be understood in more detail from the following description taken in conjunction with the accompanying drawings, in which:

FIGS. 3A, 3B, 3C, 3D, 3E and 3F are cross-sectional views of a method of manufacturing an organic light emitting display device in accordance with example embodiments;

DETAILED DESCRIPTION

Figure 1:
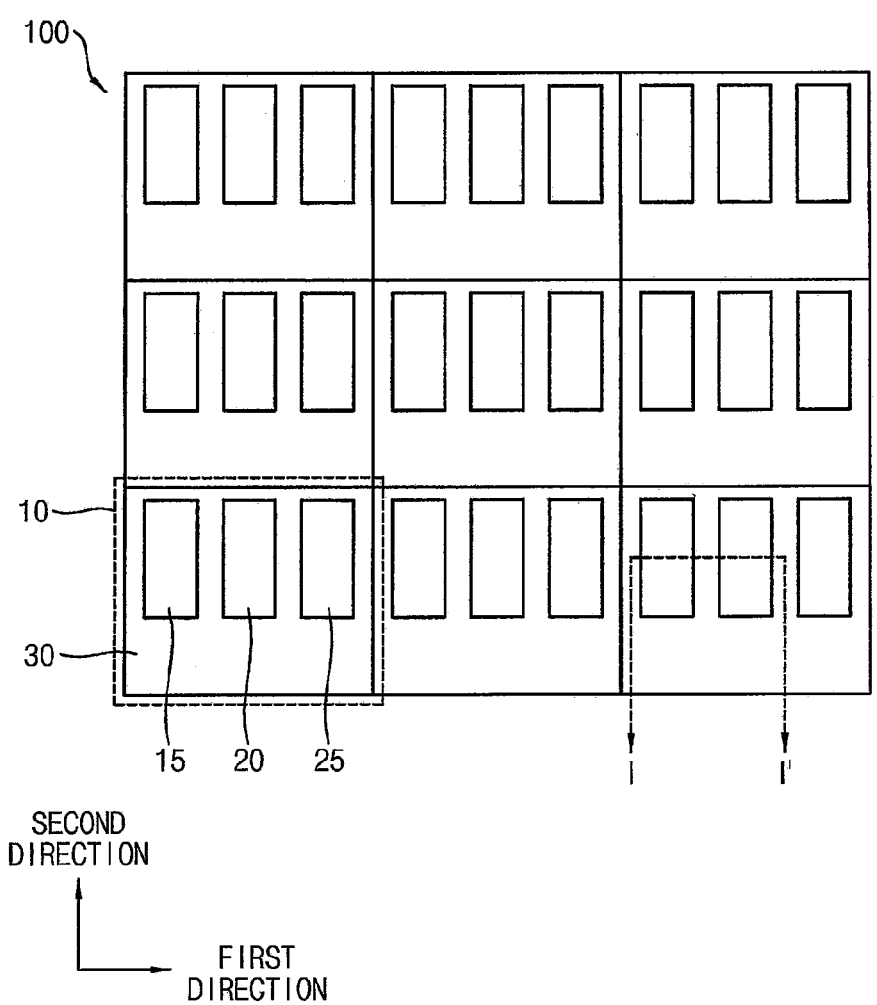
FIG. 1 is a plan view of a display panel in accordance with example embodiments.

Hereinafter, embodiments of the present invention are explained with reference to the accompanying drawings.

In the drawings, the size and thickness of each element may be arbitrarily illustrated for ease of description, and the present invention is not necessarily limited thereto.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", and "an" are intended to include the plural forms as well, unless the context clearly indicates otherwise. It will be further understood that the terms "comprises," "comprising," "includes," and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the present invention refers to "one or more embodiments of the present invention." Also, the term "exemplary" is intended to refer to an example or illustration.

It will be understood that when an element or layer is referred to as being "on", "connected to", "connected with," "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

FIG. 1 is a plan view of a display panel in accordance with example embodiments of the present invention.

Referring to FIG. 1, a display panel 100 may include a plurality of pixel regions 10. One pixel region 10 may include first, second, and third sub-pixel regions 15, 20, and 25 and a reflective region 30. The reflective region 30 may substantially surround the first, second, and third sub-pixel regions 15, 20, and 25 (e.g., may substantially surround the first, second, and third sub-pixel regions 15, 20, and 25 along a plane parallel to a displace surface of the display panel).

First, second, and third sub-pixels may be located in the first, second, and third sub-pixel regions 15, 20, and 25, respectively. For example, the first sub-pixel may be a pixel for emitting a red color, the second sub-pixel may be a pixel for emitting a green color, and the third sub-pixel may be a pixel for emitting a blue color. The first, second, and third sub-pixels may be located at the same level (or same layer) on a substrate. As used herein, the term "pixel" may refer to one of the sub-pixels that constitute a pixel or a pixel including multiple sub-pixels, as those skilled in the art would appreciate.

A reflective member may be located in the reflective region 30. The reflective member may reflect an external light. The reflective member may include openings that overlap with (or correspond to) the first, second, and third sub-pixel regions 15, 20, and 25. For example, the first, second, and third sub-pixel regions 15, 20, and 25 may respectively correspond to one of the openings of the reflective member such that the sub-pixel region and the corresponding opening may be substantially the same size.

A light blocking member may be located in the pixel region 10. The light blocking member may be substantially plate-shaped. In example embodiments, the light blocking member may include a first portion and a second portion. The first portion of the light blocking member may be substantially the same size as the first, second, and third sub-pixel regions 15, 20, and 25. That is, the first portion and the openings of the reflective member may be substantially the same size. In addition, the second portion of the light blocking member may be substantially the same size as the reflective region 30. The first portion and the second portion may include different materials relative to each other. The first portion may be transparent, and the second portion may have a color (e.g., a predetermined color, a first color, etc.). For example, a plurality of pixel regions 10 of the display panel 100 may be displayed as the first color.

Figure 2:
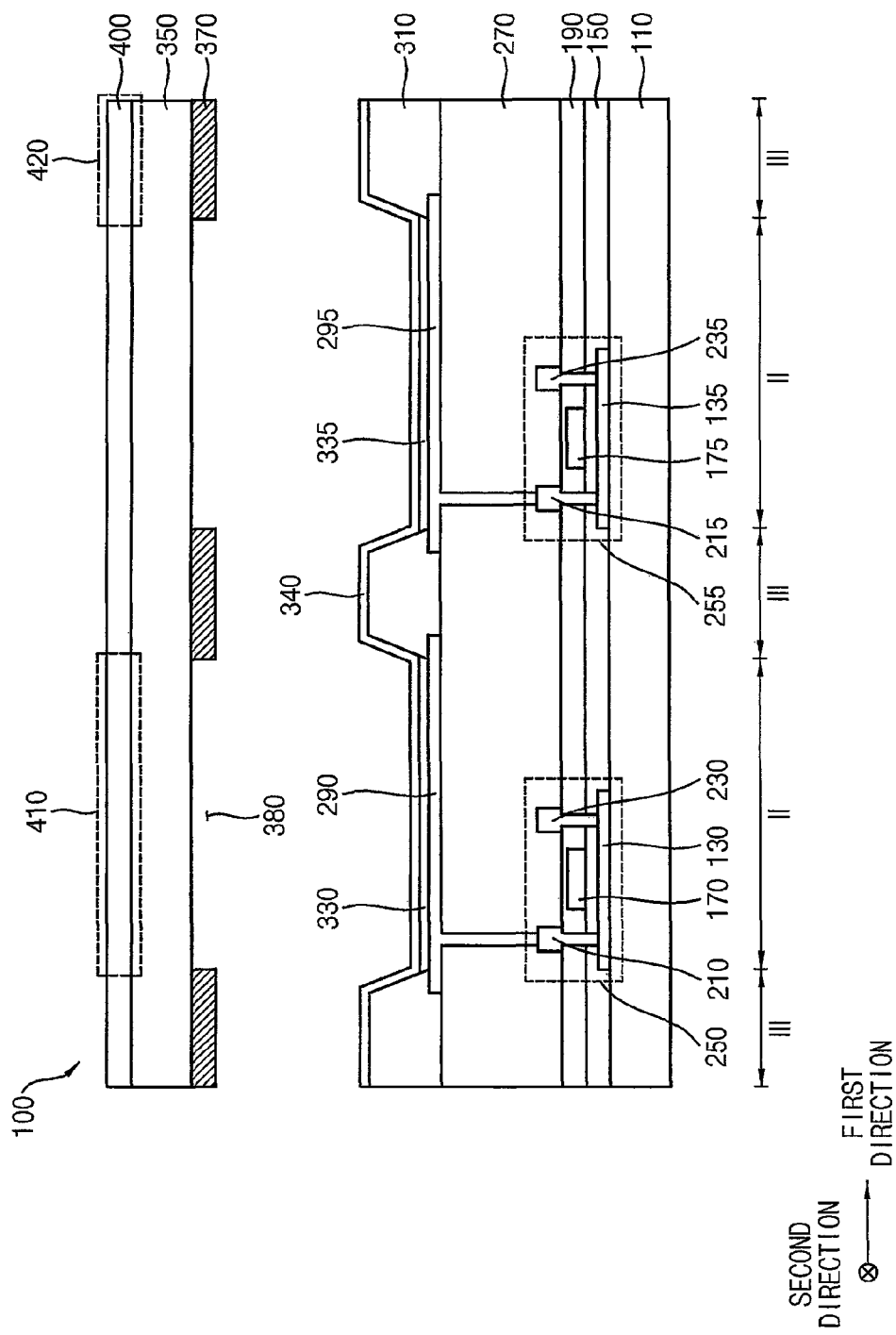
FIG. 2 is a cross-sectional view of a display panel taken along the line I-I' of FIG. 1.

FIG. 2 is a cross-sectional view of a display panel taken along the line I-I' of FIG. 1.

Referring to FIG. 2, a display panel 100 may include a substrate 110, a first insulating layer 150, a second insulating layer 190, a third insulating layer 270, first and second light emitting structures, a pixel defining layer 310, a reflective member 370, an encapsulation substrate 350, and a light blocking member 400. The first and second light emitting structures may include first and second semiconductor elements 250 and 255, respectively, first and second lower electrodes 290 and 295, respectively, first and second light emitting layers 330 and 335, respectively, and an upper electrode 340. The first and second semiconductor elements 250 and 255 may respectively include first and second active layers 130 and 135, first and second gate electrodes 170 and 175, first and second source electrodes 210 and 215, and first and second drain electrodes 230 and 235. The reflective member 370 may include openings 380.

As described above, the display panel 100 may include a plurality of pixel regions. A sub-pixel region II and a reflective region III may be included in one pixel region. The reflective region III may substantially surround the sub-pixel region II (e.g., may substantially surround the sub-pixel region II along a plane parallel to a displace surface of the display panel 100). The first and second semiconductor elements 250 and 255, the first and second lower electrode 290 and 295, the first and second light emitting layers 330 and 335, and the upper electrode 340 may be located in the sub-pixel region II. In addition, the reflective member 370 may be located in the reflective region III. The light blocking member 400 may be entirely located in the sub-pixel region II and the reflective region III. The light blocking member 400 may include a first portion 410 and a second portion 420. The first portion 410 may be substantially the same size as (or correspond to) the sub-pixel region II, and the second portion 420 may be substantially the same size as (or correspond to) the reflective region III. The light blocking member 400 may partially block light (e.g., may partially block light of a predetermined wavelength, may partially block light of a first wavelength, etc.). For example, the light blocking member 400 may block at least a portion of light in a wavelength range of light. The first portion 410 may be substantially transparent, and the second portion 420 may have a color (e.g., a predetermined color, a first color, etc.).

In one or more embodiments, a display image may be displayed in the sub-pixel regions II. An image of an object that is located in front of the display panel 100 may be reflected in the reflective region III. As the display panel 100 has the reflective region III and the light blocking member 400, the display panel 100 may serve as a mirror display device having a color (e.g., a predetermined color, a first color, etc.).

The first and second light emitting structures may be disposed on the substrate 110. The substrate 110 may include transparent materials. For example, the substrate 110 may include quartz, synthetic quartz, calcium fluoride, fluoride-doping quartz, a sodalime glass, a non-alkali glass, etc. Alternatively, the substrate 110 may include a flexible transparent resin substrate, such as, for example, a polyimide substrate. The polyimide substrate may include a first polyimide layer, a barrier film layer, a second polyimide layer, etc. When the polyimide substrate is thin and flexible, the polyimide substrate may be formed on a rigid glass substrate to help support the formation of the light emitting structures. That is, in example embodiments, the substrate 110 may have a structure in which the first polyimide layer, the barrier film layer and the second polyimide layer are stacked on a glass substrate. Here, after an insulation layer is provided on the second polyimide layer, the light emitting structures may be disposed on the insulation layer. After the light emitting structures are formed on the insulation layer, the glass substrate may be removed. It may be difficult to form the light emitting structures directly on the polyimide substrate because the polyimide substrate is thin and flexible. Accordingly, the light emitting structures may be formed on a rigid glass substrate, and then the polyimide substrate may serve as the substrate 110 after removal of the glass substrate. As the display panel 100 includes the sub-pixel region II and the reflective region III, the substrate 110 may also include the sub-pixel region II and the reflective region III.

A buffer layer may be disposed on the substrate 110. The buffer layer may extend along a first direction from the sub-pixel region II into the reflective region III. The buffer layer may prevent the diffusion (e.g., an out gassing) of metal atoms and/or impurities from the substrate 110. Additionally, the buffer layer may control a rate of heat transfer in a crystallization process for forming the first and second active layers 130 and 135, thereby obtaining substantially uniform first and second active layers 130 and 135. Furthermore, the buffer layer may improve a surface flatness of the substrate 110 when a surface of the substrate 110 is relatively irregular. For example, the buffer layer may include silicon nitride, silicon oxide, etc. In some example embodiments, according to a type of the substrate 110, at least two buffer layers may be provided on the substrate 110, or the buffer layer may be omitted.

The first and second semiconductor elements 250 and 255 may include the first and second active layers 130 and 135, the first and second gate electrodes 170 and 175, the first and second source electrodes 210 and 215, and the first and second drain electrodes 230 and 235, respectively. The first and second active layers 130 and 135 may be disposed on the substrate 110. The first and second active layers 130 and 135 may be spaced apart from each other (e.g., spaced apart from each other by a predetermined distance). The first and second active layers 130 and 135 may include an oxide semiconductor, an inorganic semiconductor (e.g., amorphous silicon, polysilicon, etc.), an organic semiconductor, etc.

The first insulating layer 150 may be disposed on the first and second active layers 130 and 135. The first insulating layer 150 may cover the first and second active layers 130 and 135 in the sub-pixel region II, and may extend along the first direction on the substrate 110. That is, the first insulating layer 150 may be disposed on the entire (or substantially entire) substrate 110. The first insulating layer 150 may include a silicon compound, a metal oxide, etc.

The first and second gate electrodes 170 and 175 may be disposed on the first insulating layer 150 under which the first and second active layers 130 and 135 are located, respectively. The first and second gate electrodes 170 and 175 may include metal, alloy, metal nitride, conductive metal oxide, transparent conductive materials, etc.

The second insulating layer 190 may be disposed on the first and second gate electrodes 170 and 175. The second insulating layer 190 may cover the first and second gate electrodes 170 and 175 in the sub-pixel region II, and may extend along the first direction on the substrate 110. That is, the second insulating layer 190 may be disposed on the entire (or substantially entire) substrate 110. The second insulating layer 190 may include a silicon compound, a metal oxide, etc.

The first and second source electrodes 210 and 215 and the first and second drain electrodes 230 and 235 may be disposed on the second insulating layer 190. The first and second source electrodes 210 and 215 may contact a first side of the first and second active layers 130 and 135, respectively, because a corresponding portion of the first and second insulating layers 150 and 190 have been removed. The first and second drain electrodes 230 and 235 may contact a second side of the first and second active layers 130 and 135, respectively, because a corresponding second portion of the first and second insulating layers 150 and 190 have been removed. Each of the first and second source electrodes 210 and 215 and the first and second drain electrodes 230 and 235 may include metal, alloy, metal nitride, conductive metal oxide, transparent conductive materials, etc.

The third insulating layer 270 may be disposed on the first and second source electrodes 210 and 215 and the first and second drain electrodes 230 and 235. The third insulating layer 270 may cover the first and second source electrodes 210 and 215 and the first and second drain electrodes 230 and 235 in the sub-pixel region II, and may extend along the first direction on the substrate 110. That is, the third insulating layer 270 may be disposed on the entire (or substantially entire) substrate 110. The third insulating layer 270 may include a silicon compound, a metal oxide, etc.

The first and second lower electrodes 290 and 295 may be disposed on the third insulating layer 270. The first and second lower electrodes 290 and 295 may contact the first and second source electrodes 210 and 215 because a corresponding portion of the third insulating layer 270 has been removed. In addition, the first and second lower electrodes 290 and 295 may be electrically connected to the first and second semiconductor elements 250 and 255. The first and second lower electrodes 290 and 295 may include metal, alloy, metal nitride, conductive metal oxide, transparent conductive materials, etc.

The pixel defining layer 310 may be disposed on the third insulating layer 270 and may expose a portion of each of the first and second lower electrodes 290 and 295. The pixel defining layer 310 may include organic materials or inorganic materials. The first and second light emitting layers 330 and 335 may be respectively disposed on at least a portion of the first and second lower electrodes 290 and 295 exposed by the pixel defining layer 310.

The first and second light emitting layers 330 and 335 may be disposed on the exposed portion of the first and second lower electrodes 290 and 295, respectively. The first and second light emitting layers 330 and 335 may be formed using light emitting materials capable of generating different colors of light (e.g., a red color of light, a blue color of light, and a green color of light) according to the first, second, and third sub-pixels illustrated in FIG. 1.

The upper electrode 340 may be disposed on the pixel defining layer 310 and the first and second light emitting layers 330 and 335. The upper electrode 340 may cover the pixel defining layer 310 and the first and second light emitting layers 330 and 335 in the sub pixel-region II and the reflective region III, and may extend along the first direction on the substrate 110. That is, the upper electrode 340 may be shared by (e.g., electrically connected to) the first and second light emitting layers 330 and 335. The upper electrode 340 may include metal, alloy, metal nitride, conductive metal oxide, a transparent conductive material, etc. These may be used alone or in a suitable combination thereof.

The reflective member 370 may be located over the upper electrode 340. The reflective member 370 may be disposed on a lower surface of the encapsulation substrate 350. The reflective member 370 may overlap with the reflective region III. The reflective member 370 may extend along a second direction on the lower surface of the encapsulation substrate 350. The second direction may be perpendicular to the first direction. In addition, the reflective member 370 may include openings 380. Each of the openings 380 may substantially overlap with the sub-pixel region II, as illustrated in FIG. 2.

A first surface of the reflective member 370 may face the upper electrode 340, and a second surface of the reflective member 370 opposite to the first surface may contact the encapsulation substrate 350. Incident light (e.g., external light) that is transmitted via encapsulation substrate 350 may be reflected from the second surface. As such, an image of an object that is located in front of the display panel 100 may be displayed on the second surface of the reflective member 370. Light generated from the first and second light emitting layers 330 and 335 of the display panel 100 may travel via the openings 380 located in the sub-pixel region II. The reflective member 370 may include a material having a relatively high reflectivity. For example, the reflective member 370 may include gold (Au), silver (Ag), aluminum (Al), platinum (Pt), nickel (Ni), titanium (Ti), etc. Alternately, the reflective member 370 may include an alloy, metal nitride, conductive metal oxide, a transparent conductive material, etc. For example, the reflective member 370 may include an aluminum alloy, aluminum nitride (AlNx), a silver alloy, tungsten nitride (WNx), a copper alloy, chrome nitride (CrNx), a molybdenum alloy, titanium nitride (TiNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc.

The encapsulation substrate 350 may be disposed on the reflective member 370. The encapsulation substrate 350 and the substrate 110 may include substantially the same materials. For example, the encapsulation substrate 350 may include quartz, synthetic quartz, calcium fluoride, fluoride-doping quartz, sodalime glass, non-alkali glass, etc. In some example embodiments, the encapsulation substrate 350 may include a transparent inorganic material or flexible plastic. For example, the encapsulation substrate 350 may include a flexible transparent resin substrate. To increase flexibility of the display panel 100, the encapsulation substrate 350 may include a stacked structure where at least one organic layer and at least one inorganic layer are alternately (or repeatedly) stacked.

The light blocking member 400 may be disposed on an upper surface of the encapsulation substrate 350. The light blocking member 400 may extend along the first and second directions on the encapsulation substrate 350. That is, the light blocking member 400 may be disposed on the entire encapsulation substrate 350. The light blocking member 400 may be substantially plate-shaped. The light blocking member 400 may include the first portion 410 and the second portion 420. The first portion 410 may overlap with the sub-pixel region II. The first portion 410 and the openings 380 of the reflective member 370 may be substantially the same size. That is, light generated from the first and second light emitting layers 330 and 335 of the display panel 100 may travel via the first portion 410. The second portion 420 may overlap with the reflective region III. The second portion 420 and the reflective member 370 may be substantially the same size. That is, an object located in front of the display panel 100 may be reflected from the second surface of the reflective member 370 and the image of the object may be displayed via the second portion 420. The light blocking member 400 may block at least a portion of light (e.g., may block at least a portion of light in a predetermined wavelength range). That is, the light blocking member 400 may partially block light (e.g., may partially block the light of a predetermined wavelength, may partially block the light of a first wavelength, etc.). In particular, the light blocking member 400 may block a light (e.g., ultraviolet rays) of a wavelength range of ultraviolet rays (UV) and may block at least a portion of light in a wavelength range of visible light (e.g., partially block visible light of a predetermined wavelength). In example embodiments, the first portion 410 may block UV. The second portion 420 may block UV, and may partially block visible light of a wavelength (e.g., a first wavelength). The light blocking member 400 may include an acrylic optical film including a material capable of blocking the UV. For example, the UV blocking material may include benzotriazole based compound, benzophenone based compound, cyano acrylate based compound, salicylic acid based compound, etc. Thus, the first portion 410 and the second portion 420 may block a light of a wavelength range of UV. In addition, the second portion 420 may further include a pigment and/or dye. The pigment that is used in the second portion 420 may include azo lake organic pigments, quinacridone organic pigments, phthalocyanine organic pigments, isoindoline organic pigments, anthraquinone organic pigments, thioindigo organic pigments, chrome yellow, chrome blue, iron oxide, chrome vermilion, chrome green, ultramarine, emerald green, titanium white, carbon black, etc. These may be used alone or in a suitable combination thereof. The dye that is used in the second portion 420 may include azo dyes, anthraquinone dyes, benzodifuranone dyes, condensed methane dyes, etc. These may be used alone or in a suitable combination thereof. As the second portion 420 of the light blocking member 400 may include at least one selected from the pigments and/or the dyes, the second portion 420 may partially block visible light (e.g., may partially block visible light of a predetermined wavelength). The first portion 410 may be transparent, and the second portion 420 may have a color according to the pigments and/or the dyes used (e.g., may have a predetermined color, may have a first color, etc.). For example, when a material blocking a yellow color light is selected, the second portion 420 may have a yellow color. Here, the second portion 420 may block the visible light of a wavelength range corresponding to the yellow color light. That is, the second portion 420 may have various colors according to selected materials, and may block the visible light of a predetermined wavelength. Intensity of the light that is blocked by the second portion 420 may be adjusted by controlling an amount of the materials used (e.g., the pigments and the dyes). For example, when the amount of the light blocking materials is relatively increased, the intensity of the blocked light may be relatively increased in the second portion 420. Similarly, when the amount of the light blocking materials is relatively decreased, the intensity of the blocked light may be relatively decreased in the second portion 420. That is, the amount of the materials may be proportional to the intensity of the blocked light.

In some example embodiments, the first portion 410 may block a light of a wavelength range of UV. The second portion 420 may partially block visible light of a predetermined wavelength. For example, the first portion 410 may include an acrylic optical film including a material capable of blocking the UV. Thus, the first portion 410 may block a light of a wavelength range of UV. The second portion 420 may include at least one selected from the pigments and/or the dyes. As the second portion 420 may include at least one selected from the pigments and/or the dyes, the second portion 420 may partially block visible light (e.g., may partially block light of a predetermined wavelength). The first portion 410 may be substantially transparent, and the second portion 420 may have a predetermined color according to the pigments and/or the dyes used. In some embodiments wherein the reflective member 370 blocks a light of a wavelength range of UV, a material blocking the UV may be omitted from the second portion 420.

In some example embodiments, the first portion 410 and the second portion 420 may block a light of wavelength range of UV, and may partially block visible light (e.g., may partially block visible light of a predetermined wavelength). For example, the first portion 410 and the second portion 420 may include an acrylic optical film including a material capable of blocking the UV. Thus, the first portion 410 and the second portion 420 may block the UV. In addition, the first portion 410 and the second portion 420 may further include the pigments and/or the dyes. As the first portion 410 and the second portion 420 may include at least one selected from the pigments and/or the dyes, the first portion 410 and the second portion 420 may partially block visible light (e.g., may partially block visible light of a predetermined wavelength). The first portion 410 and the second portion 420 may have a color according to the pigments and/or the dyes (e.g., may have a predetermined color, may have a first color, etc.). Here, when light emitted from the first and second light emitting layers 330 and 335 travels through the first portion 410, at least a portion of the emitted light may be blocked according to the selected materials. In addition, after incident light is reflected from reflective member 370, the incident light that is passed through the second portion 420 and the blocked light may be the same color. Thus, the light that is passed through the first portion 410 and has a relatively decreased intensity may be superposed with the incident light that is passed through the second portion 420. As such, the visibility of the display panel 100 may be improved by adjusting gamma values of the display panel 100 (e.g., adjusting a light emitting ratio of red, green, or blue).

The display panel 100 according to example embodiments may include the reflective member 370 having the openings 380 and the light blocking member 400 having the first portion 410 and the second portion 420. Accordingly, the display panel 100 may serve as a mirror display device having a predetermined color. As the mirror display device has various colors, the display panel 100 may have various applications. In addition, since the UV is blocked, deterioration of the light emitting structures included in the display panel 100 may be decreased.

FIGS. 3A through 3F are cross-sectional views illustrating a method of manufacturing an organic light emitting display device in accordance with example embodiments.

Figure 3A:
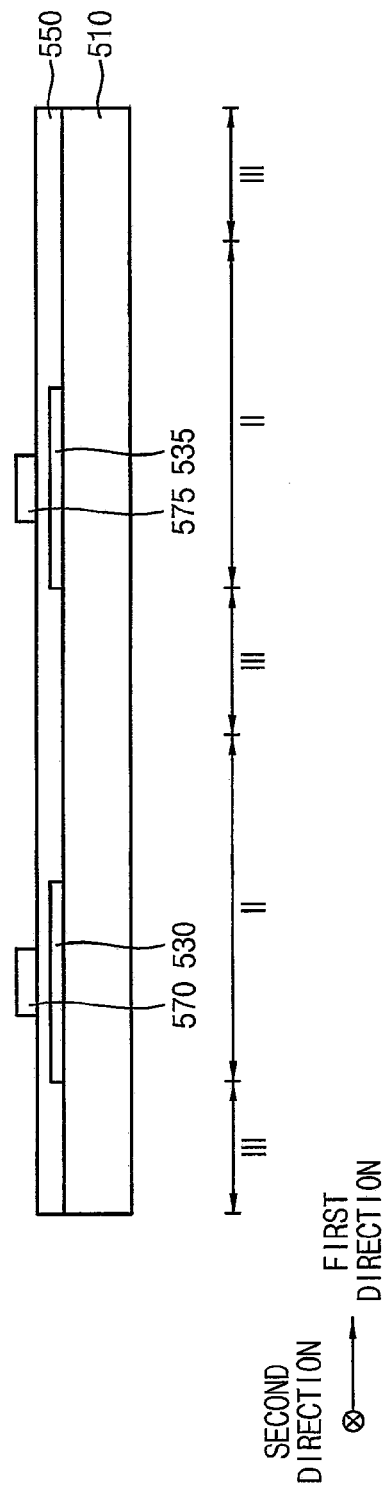

Referring to FIG. 3A, first and second active layers 530 and 535 may be formed in a sub-pixel region II on a substrate 510. The substrate 510 may be formed using quartz, synthetic quartz, calcium fluoride, fluoride-doping quartz, a sodalime glass, a non-alkali glass, etc. In some embodiments, a buffer layer may be formed on the substrate 510. The buffer layer may extend along a first direction from the sub-pixel region II into the reflective region III. The buffer layer may be formed on the entire (or substantially entire) substrate 510. The buffer layer may prevent the diffusion of metal atoms and/or impurities from the substrate 510. The first and second active layers 530 and 535 may be formed on the substrate 510 in the sub-pixel region II. The first and second active layers 530 and 535 may be formed using an oxide semiconductor, an inorganic semiconductor, an organic semiconductor, etc. A first insulating layer 550 may be formed on the substrate 510 (with or without a buffer layer interposed therebetween). The first insulating layer 550 may cover the first and second active layers 530 and 535, and may extend along the first direction. The first insulating layer 550 may be formed on the entire (or substantially entire) substrate 510. The first insulating layer 550 may be formed using a silicon compound, a metal oxide, etc. First and second gate electrodes 570 and 575 may be formed on the first insulating layer 550 under which the first and second active layers 530 and 535 are located, respectively. The first and second gate electrodes 570 and 575 may be formed using metal, alloy, metal nitride, conductive metal oxide, transparent conductive materials, etc.

Figure 3B:
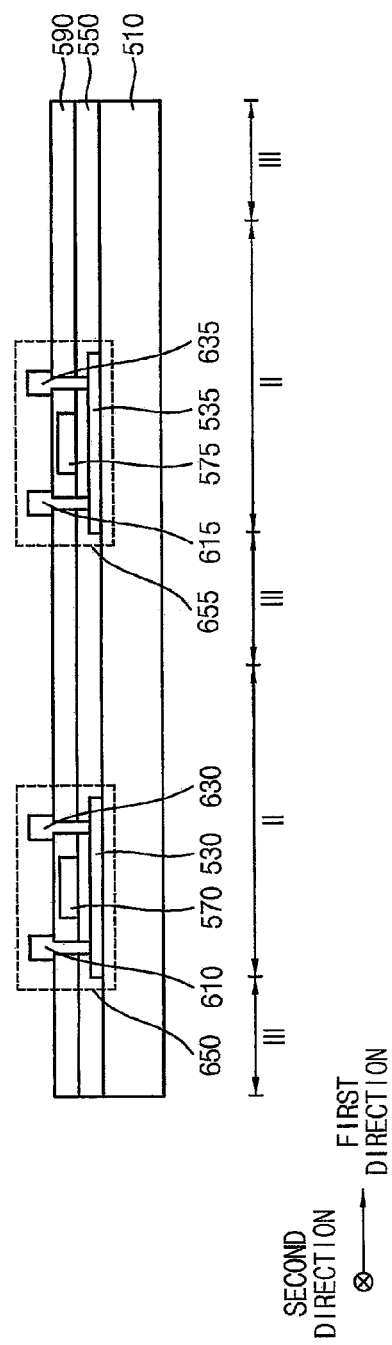

Referring to FIG. 3B, a second insulating layer 590 may be formed on the first and second gate electrodes 570 and 575. The second insulating layer 590 may cover the first and second gate electrodes 570 and 575, and may extend along the first direction on the first insulating layer 550. The second insulating layer 590 may be formed in the sub-pixel region II and the reflective region III on the entire (or substantially entire) substrate 510. The second insulating layer 590 may be formed using a silicon compound, a metal oxide, etc. First and second source electrodes 610 and 615 and the first and second drain electrodes 630 and 635 may be formed on the second insulating layer 590. The first and second source electrodes 610 and 615 may contact a first side of the first and second active layers 530 and 535, respectively, because a portion of the first and second insulating layers 550 and 590 have been removed. The first and second drain electrodes 630 and 635 may contact a second side of the first and second active layers 530 and 535, respectively, because a second portion of the first and second insulating layers 550 and 590 have been removed. Each of the first and second source electrodes 610 and 615 and the first and second drain electrodes 630 and 635 may include metal, alloy, metal nitride, conductive metal oxide, transparent conductive materials, etc. These may be used alone or in a suitable combination thereof. Thus, first and second semiconductor elements 650 and 655 having the first and second active layers 530 and 535, the first and second gate electrodes 570 and 575, the first and second source electrodes 610 and 615 and the first and second drain electrodes 630 and 635, respectively, may be formed.

Figure 3C:
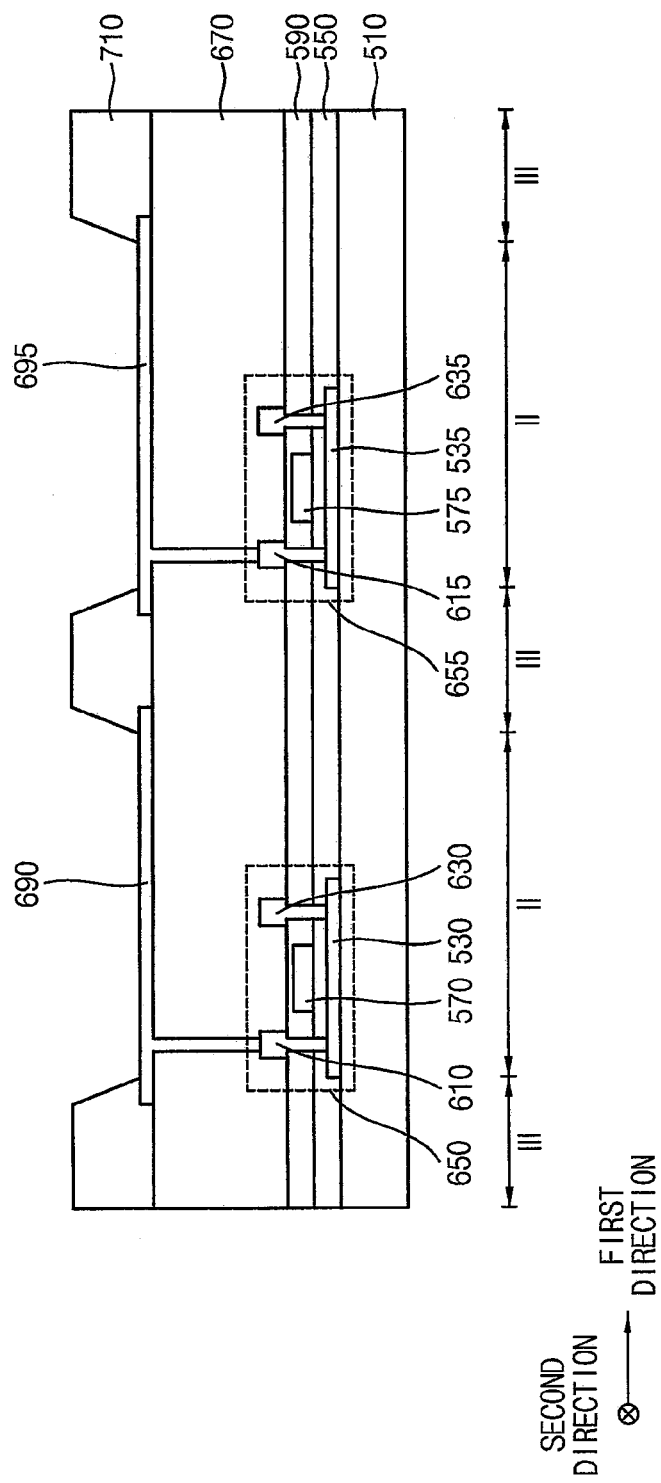

Referring to FIG. 3C, a third insulating layer 670 may be formed on the second insulating layer 590. The third insulating layer 670 may cover the first and second source electrodes 610 and 615 and the first and second drain electrodes 630 and 635, and may extend along the first direction on the second insulating layer 590. The third insulating layer 670 may be formed in the sub-pixel region II and the reflective region III on the entire (or substantially entire) substrate 510. The third insulating layer 670 may be formed using a silicon compound, a metal oxide, etc. First and second lower electrodes 690 and 695 may be formed on the third insulating layer 670. The first and second lower electrodes 690 and 695 may contact the first and second source electrodes 610 and 615, respectively, because a portion of the third insulating layer 670 has been removed. The first and second lower electrodes 690 and 695 may be formed using metal, alloy, metal nitride, conductive metal oxide, transparent conductive materials, etc. A pixel defining layer 710 may be formed on a portion of the third insulating layer 270 and a portion of the first and second lower electrodes 690 and 695. The pixel defining layer 710 may be formed on the third insulating layer 670 to expose a portion of each of the first and second lower electrodes 690 and 695. The pixel defining layer 710 may be formed using organic materials or inorganic materials.

Figure 3D:
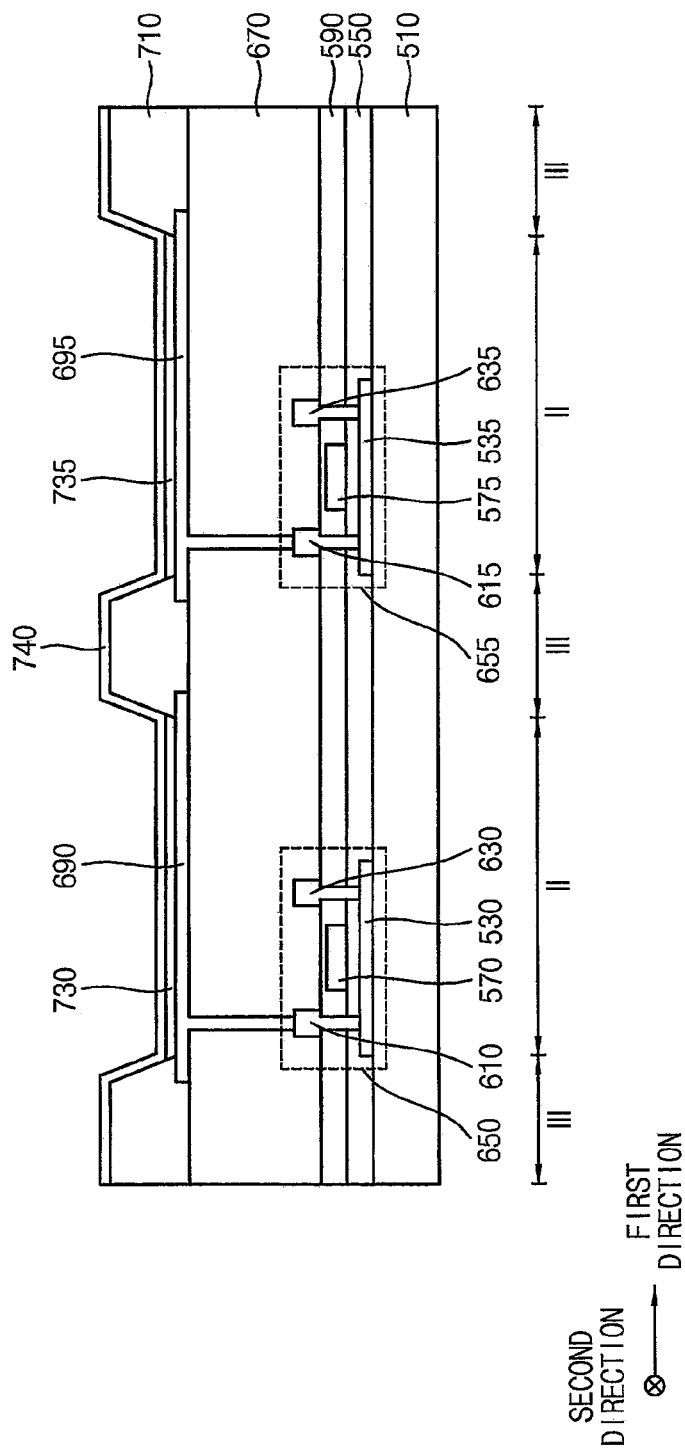

Referring to FIG. 3D, first and second light emitting layers 730 and 735 may be formed on the exposed portion of the first and second lower electrodes 690 and 695, respectively. The first and second light emitting layers 730 and 735 may be formed using light emitting materials capable of generating different colors of light (e.g., a red color of light, a blue color of light, and a green color of light) according to the first, second, and third sub-pixels. An upper electrode 740 may be formed on the pixel defining layer 610 and the first and second light emitting layers 730 and 735. The upper electrode 740 may cover the pixel defining layer 710 and the first and second light emitting layers 730 and 735 in the sub-pixel region II and the reflective region III, and may extend along the first direction on the pixel defining layer 710 and the first and second light emitting layers 730 and 735. That is, the upper electrode 740 may be shared by the first and second light emitting layers 730 and 735. The upper electrode 740 may be formed using metal, alloy, metal nitride, conductive metal oxide, a transparent conductive material, etc. These may be used alone or in a suitable combination thereof.

Referring to FIG. 3E, an encapsulation substrate 750 may be provided. The encapsulation substrate 750 and the substrate 510 may include substantially the same materials. For example, the encapsulation substrate 750 may be formed using quartz, synthetic quartz, calcium fluoride, fluoride-doping quartz, sodalime glass, non-alkali glass etc. In some example embodiments, the encapsulation substrate 750 may be formed using a transparent inorganic material or flexible plastic. For example, the encapsulation substrate 750 may include a flexible transparent resin substrate. To increase flexibility of the display panel, the encapsulation substrate 750 may include a stacked structure where at least one organic layer and at least one inorganic layer are alternately stacked.

A reflective member 770 may be formed on a lower surface of the encapsulation substrate 750. The reflective member 770 may be formed to overlap with the reflective region III. The reflective member 770 may extend along a second direction on the lower surface of the encapsulation substrate 750. In some embodiments, the second direction may be perpendicular to the first direction. In addition, openings 780 may be formed in the reflective member 770. Each of the openings 780 may be formed to substantially overlap with the sub-pixel region II.

A first surface of the reflective member 770 may face the upper electrode 740, and a second surface of the reflective member 770 opposite to the first surface may contact the encapsulation substrate 750. Incident light that is transmitted via the encapsulation substrate 350 may be reflected from the second surface. For example, an image of an object that is located in front of the display panel may be displayed on the second surface of the reflective member 770. Light generated from the first and second light emitting layers 730 and 735 of the display panel may travel via the openings 780 located in the sub-pixel region II. The reflective member 770 may be formed of a material having a relatively high reflectivity. For example, the reflective member 770 may be formed using Au, Ag, Al, Pt, Ni, Ti, etc. Alternately, the reflective member 770 may be formed using an alloy, metal nitride, conductive metal oxide, a transparent conductive material, etc. For example, the reflective member 770 may include an aluminum alloy, AlNx, a silver alloy, WNx, a copper alloy, CrNx, a molybdenum alloy, TiNx, TaNx, SRO, ZnOx, ITO, SnOx, InOx, GaOx, IZO, etc. The encapsulation substrate 750 having the reflective member 770 may be formed on the upper electrode 740 by performing an encapsulation method.

Figure 3F:
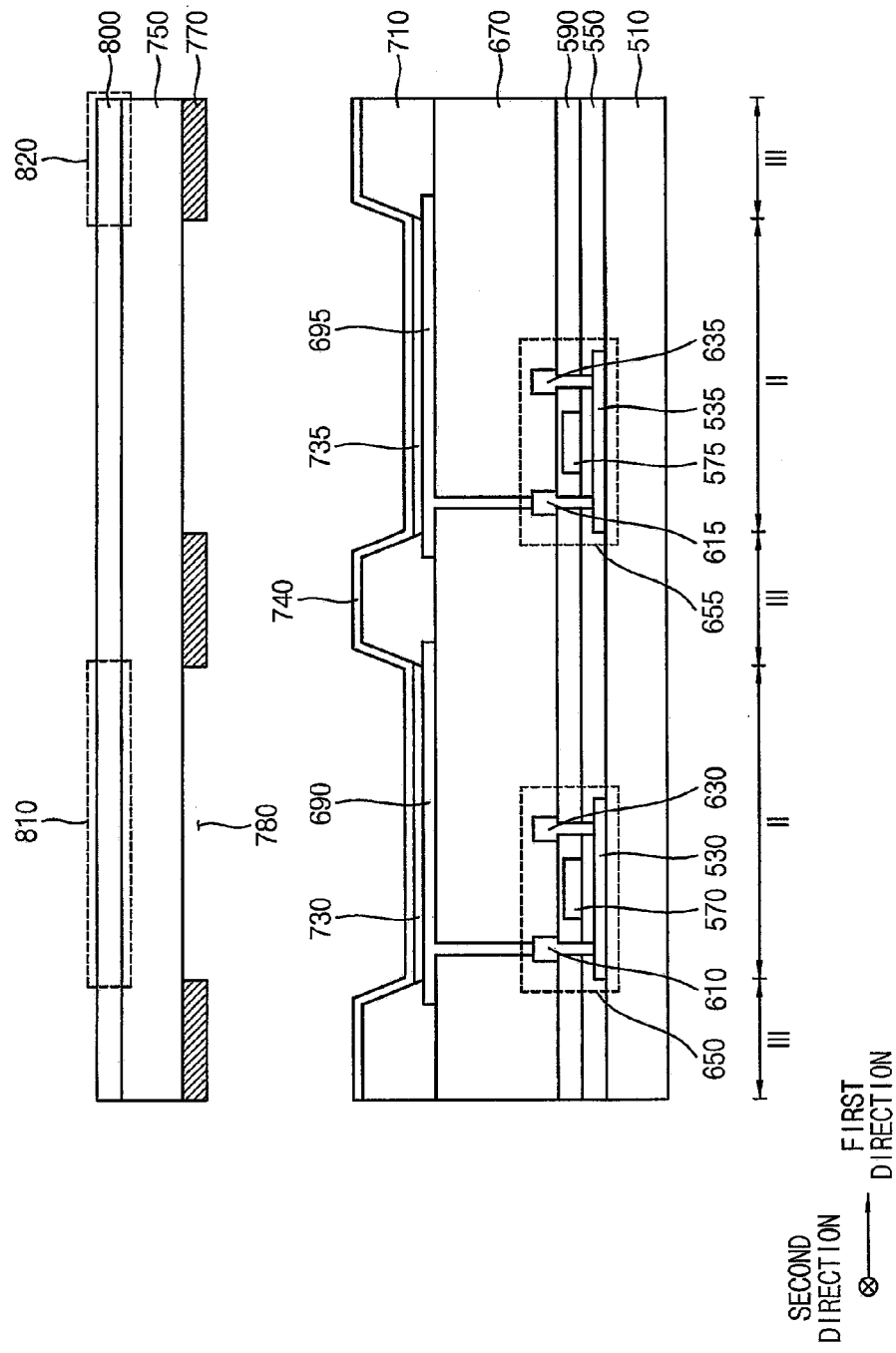

Referring to FIG. 3F, the light blocking member 800 may be formed on an upper surface of the encapsulation substrate 750. The light blocking member 800 may extend along the first and second directions on the encapsulation substrate 750. That is, the light blocking member 800 may be formed on the entire encapsulation substrate 750. For example, the light blocking member 800 may be substantially plate-shaped. The light blocking member 800 may include a first portion 810 and a second portion 820. The first portion 810 may be formed to overlap with the sub-pixel region II. The first portion 810 and the openings 780 of the reflective member 770 may be substantially the same size. Thus, light generated from the first and second light emitting layers 730 and 735 of the display panel may travel via the first portion 810. The second portion 820 may be formed to overlap with the reflective region III. The second portion 820 and the reflective member 770 may be substantially the same size. Thus, an image of an object that is located in front of the display panel may be reflected from the second surface of the reflective member 770 and the image of the object may be displayed via the second portion 820. The light blocking member 800 may block at least a portion of light (e.g., may block at least a portion of light in a predetermined wavelength range). That is, the light blocking member 800 may partially block light of a wavelength (e.g., a first wavelength, a predetermined wavelength, etc.). In particular, the light blocking member 800 may block ultraviolet rays (UV) and may block at least a portion of light in a wavelength range of visible light (e.g., partially block visible light of a predetermined wavelength). In example embodiments, the first portion 810 may block UV. The second portion 820 may block UV, and may partially block visible light of a first wavelength. In forming the light blocking member 800, UV blocking materials may be formed on the entire (or substantially entire) encapsulation substrate 750. For example, the UV blocking materials may be formed using benzotriazole based compound, benzophenone based compound, cyano acrylate based compound, salicylic acid based compound, etc.

After the UV blocking materials are formed, a pigment and/or a dye may be formed in the second portion 820. For example, the pigment that is used in the second portion 820 may be formed using azo lake organic pigments, quinacridone organic pigments, phthalocyanine organic pigments, isoindoline organic pigments, anthraquinone organic pigments, thioindigo organic pigments, chrome yellow, chrome blue, iron oxide, chrome vermilion, chrome green, ultramarine, emerald green, titanium white, carbon black, etc. These may be used alone or in a suitable combination thereof. The dye that is used in the second portion 820 may be formed using azo dyes, anthraquinone dyes, benzodifuranone dyes, condensed methane dyes, etc. These may be used alone or in a suitable combination thereof. Thus, the first portion 810 and the second portion 820 may block UV. In addition, as the second portion 820 of the light blocking member 800 may include at least one selected from the pigments and/or the dyes, the second portion 820 may partially block visible light (e.g., may partially block light of a predetermined wavelength). The first portion 810 may be transparent, and the second portion 820 may have a predetermined color according to the pigments and/or the dyes used. For example, when the light blocking member 800 is formed using a material blocking a yellow color light, the second portion 820 may have a yellow color. Here, the second portion 820 may block the visible light of a wavelength range corresponding to the yellow color light. That is, the second portion 820 may have various colors according to selected materials, and may block visible light accordingly. Intensity of the light that is blocked by the second portion 820 may be adjusted by controlling an amount of the materials (e.g., the pigments and the dyes). For example, when the amount of the light blocking materials is relatively increased, the intensity of the blocked light may be relatively increased in the second portion 820. Similarly, when the amount of the light blocking materials is relatively decreased, the intensity of the blocked light may be relatively decreased in the second portion 820. That is, the amount of the materials may be proportional to the intensity of the blocked light.

Figure 4:
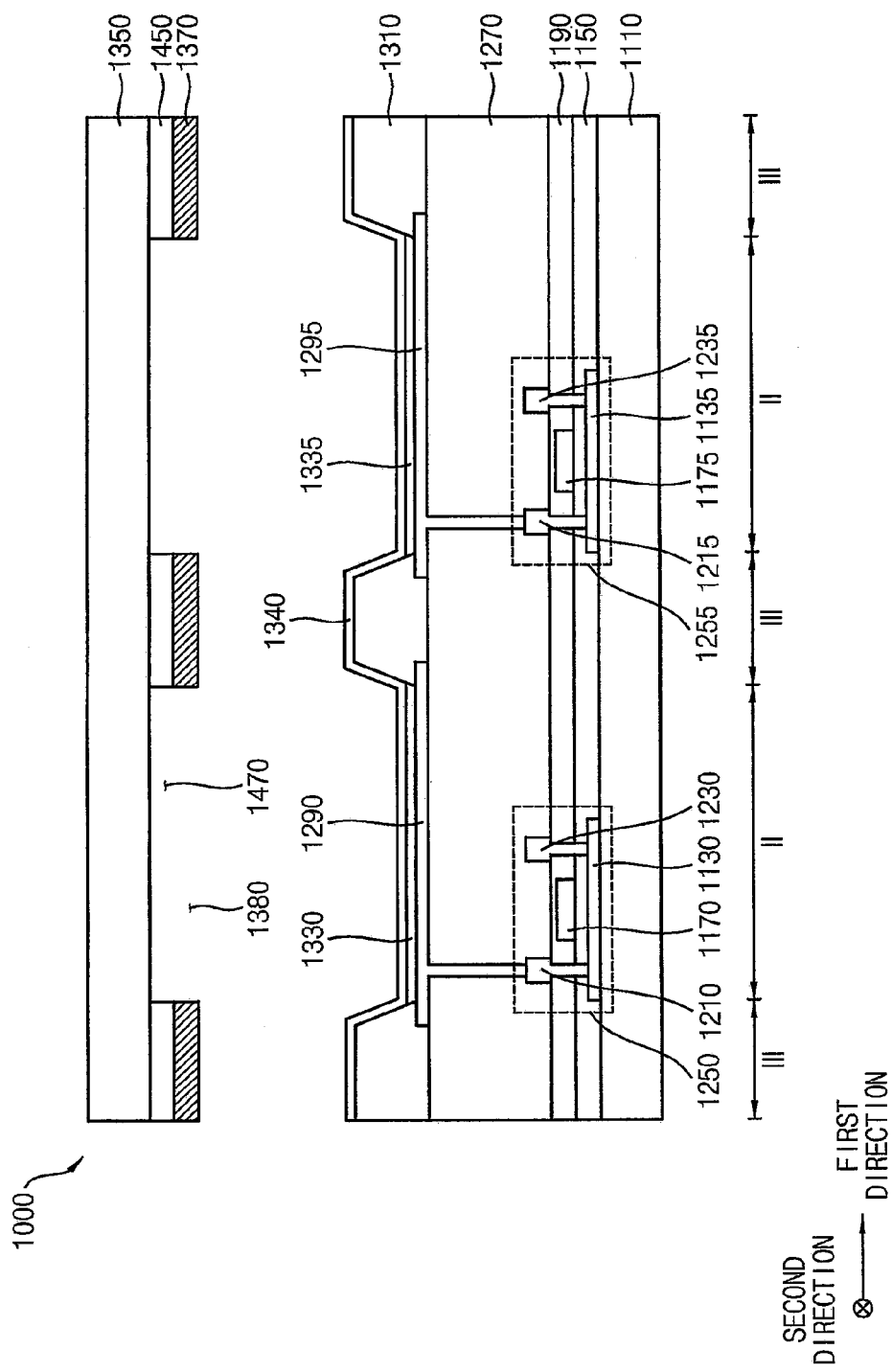
FIG. 4 is a cross-sectional view of a display panel in accordance with example embodiments.

FIG. 4 is a cross sectional view illustrating a display panel in accordance with example embodiments of the present invention. A display panel 1000 illustrated in FIG. 4 may have a configuration that is substantially the same as or similar to that of the display panel 100 described with reference to FIG. 2 except the display panel 1000 may further include a transparent member 1450. Detailed descriptions of elements which are substantially the same as or similar to the elements described with reference to FIG. 2 may be omitted.

Referring to FIG. 4, a display panel 1000 may include a substrate 1110, a first insulating layer 1150, a second insulating layer 1190, a third insulating layer 1270, first and second light emitting structures, a pixel defining layer 1310, a reflective member 1370, a transparent member 1450, and an encapsulation substrate 1350. The first and second light emitting structures may include first and second semiconductor elements 1250 and 1255, respectively, first and second lower electrodes 1290 and 1295, respectively, first and second light emitting layers 1330 and 1335, respectively, and an upper electrode 1340. The first and second semiconductor elements 1250 and 1255 may respectively include first and second active layers 1130 and 1135, first and second gate electrodes 1170 and 1175, first and second source electrodes 1210 and 1215, and first and second drain electrodes 1230 and 1235. The reflective member 1370 may include first openings 1380. In addition, the transparent member 1450 may include second openings 1470.

As described above, the display panel 1000 may include a plurality of pixel regions. A sub-pixel region II and a reflective region III may be included in one pixel region. The reflective region III may substantially surround the sub-pixel region II (e.g., may substantially surround the sub-pixel region II along a plane parallel to a displace surface of the display panel 1000). The first and second semiconductor elements 1250 and 1255, the first and second lower electrode 1290 and 1295, the first and second light emitting layers 1330 and 1335, and the upper electrode 1340 may be located in the sub-pixel region II. In addition, the reflective member 1370 and the transparent member 1450 may be located in the reflective region III. The transparent member 1450 may have a color (e.g., may have a predetermined color, a first color, etc.).

A display image may be displayed in the sub-pixel regions II. An image of an object that is located in front of the display panel 1000 may be reflected in the reflective region III. As the display panel 1000 has the reflective region III and the transparent member 1450, the display panel 1000 may serve as a mirror display device having a color, for example, a first color.

The reflective member 1370 may be located above (or facing) the upper electrode 1340. The transparent member 1450 may be interposed between the encapsulation substrate 1350 and the reflective member 1370. That is, the transparent member 1450 may be disposed on a lower surface of the encapsulation substrate 1350. The reflective member 1370 and the transparent member 1450 may overlap with the reflective region III. The reflective member 1370 and the transparent member 1450 may extend along a second direction on the lower surface of the encapsulation substrate 1350. In some embodiments, the second direction may be perpendicular to the first direction. In addition, each of the reflective member 1370 and the transparent member 1450 may include first openings 1380 and second openings 1470. The first openings 1380 and the second openings 1470 may each be the same size. The first openings 1380 and the second openings 1470 may substantially overlap with the sub-pixel region II. That is, a shape of the reflective member 1370 may be substantially the same as that of the transparent member 1450. In example embodiments, the transparent member 1450 may include a color filter having a color (e.g., a predetermined color).

A first surface of the reflective member 1370 may be opposite to the upper electrode 1340, and a second surface of the reflective member 1370 may contact the transparent member 1450. Incident light that is transmitted via encapsulation substrate 1350 and the transparent member 1450 may be reflected from the second surface. For example, an image of an object that is located in front of the display panel 1000 may be displayed on the second surface of the reflective member 1370. The reflected light may travel through the transparent member 1450, and the display panel 1000 may have a predetermined color.

The display panel 1000 according to example embodiments may include the reflective member 1370 having the first openings 1380 and the transparent member 1450 having the second openings 1470. Accordingly, the display panel 1000 may serve as a mirror display device having a color (e.g., a predetermined color, a first color, etc.). As the mirror display device has various colors, the display panel 1000 may have various applications.

Figure 5:
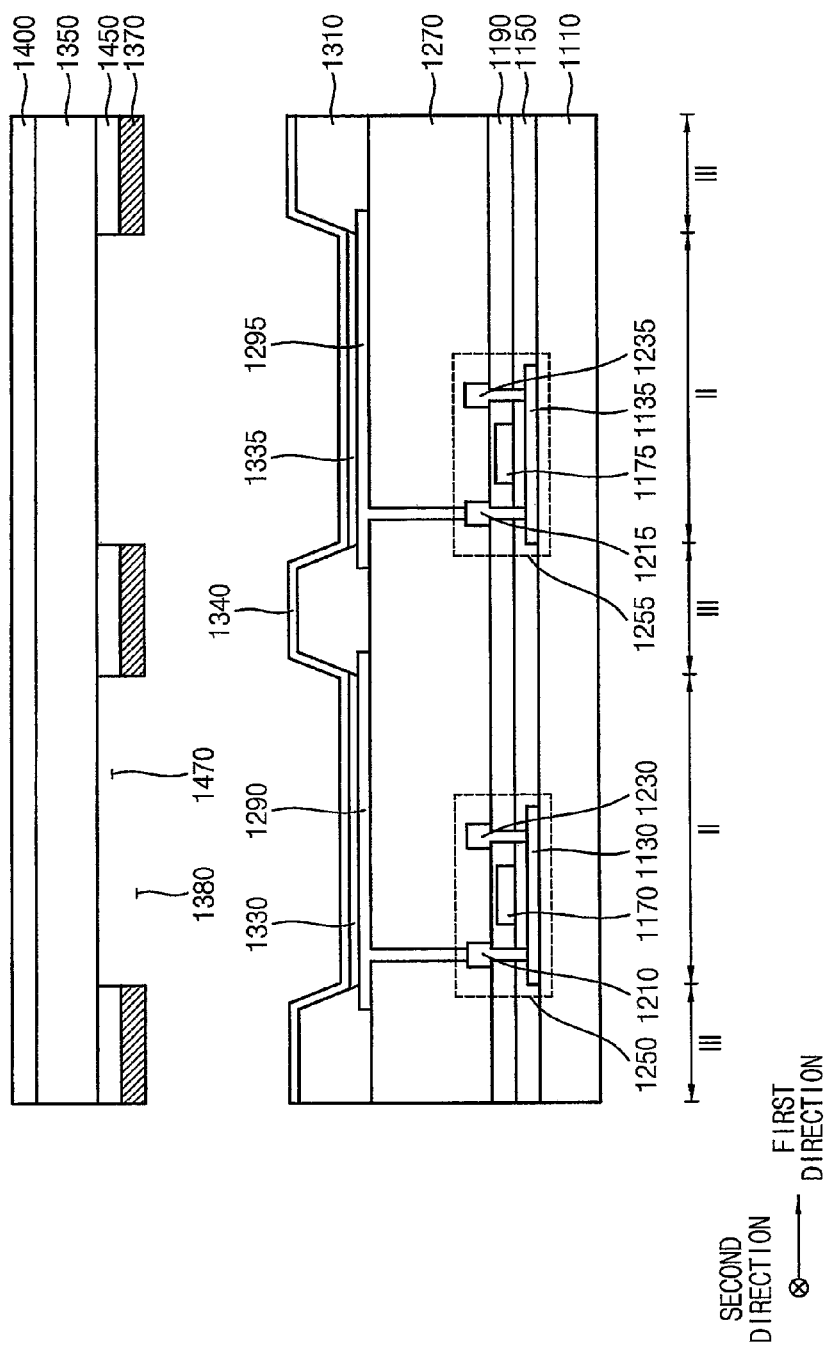
FIG. 5 is a cross-sectional view of a display panel in accordance with example embodiments.

FIG. 5 is a cross-sectional view illustrating a display panel in accordance with example embodiments of the present invention. A display panel illustrated in FIG. 5 may have a configuration substantially the same as or similar to that of the display panel 1000 described with reference to FIG. 4, except the display panel may further include a light blocking member 1400. Detailed descriptions of elements which are substantially the same as or similar to the elements described with reference to FIG. 4 may be omitted.

Referring to FIG. 5, a display panel may include a substrate 1110, a first insulating layer 1150, a second insulating layer 1190, a third insulating layer 1270, first and second light emitting structures, a pixel defining layer 1310, a reflective member 1370, a transparent member 1450, an encapsulation substrate 1350, and a light blocking member 1400. The first and second light emitting structures may include first and second semiconductor elements 1250 and 1255, respectively, first and second lower electrodes 1290 and 1295, respectively, first and second light emitting layers 1330 and 1335, respectively, and an upper electrode 1340. The first and second semiconductor elements 1250 and 1255 may include first and second active layers 1130 and 1135, first and second gate electrodes 1170 and 1175, first and second source electrodes 1210 and 1215, and first and second drain electrodes 1230 and 1235, respectively. The reflective member 1370 may include first openings 1380. In addition, the transparent member 1450 may include second openings 1470.

As described above, the display panel may include a plurality of pixel regions. A sub-pixel region II and a reflective region III may be included in one pixel region. The reflective region III may substantially surround the sub-pixel region II (e.g., may substantially surround the sub-pixel region II along a plane parallel to a displace surface of the display panel 1000). The first and second semiconductor elements 1250 and 1255, the first and second lower electrode 1290 and 1295, the first and second light emitting layers 1330 and 1335, and the upper electrode 1340 may be located in the sub-pixel region II. In addition, the reflective member 1370 and the transparent member 1450 may be located in the reflective region III. In some embodiments, the transparent member 1450 may have a color (e.g., a predetermined color, a first color, etc.). Further, the light blocking member 1400 may be located in the entire (or substantially entire) sub-pixel region II and the reflective region III. The light blocking member 1400 may partially block a light of a predetermined wavelength. The light blocking member 1400 may be transparent.

For example, a display image may be displayed in the sub-pixel regions II. An image of an object that is located in the front of the display panel may be reflected in the reflective region III. As the display panel has the reflective region III and the transparent member 1450, the display panel may serve as a mirror display device having a color.

The light blocking member 1400 may be disposed on an upper surface of the encapsulation substrate 1350. The light blocking member 1400 may extend along first and second directions on the encapsulation substrate 1350. In some embodiments, the first direction may correspond to the direction in which the sub-pixel regions II and the reflective region III adjacently extend, and the second direction may be substantially perpendicular to the first direction, as illustrated in FIGS. 1 and 5. That is, the light blocking member 1400 may be disposed on the entire (or substantially entire) encapsulation substrate 1350. For example, the light blocking member 1400 may be substantially plate-shaped. The light blocking member 1400 may be transparent. In example embodiments, the light blocking member 1400 may partially block light (e.g., may partially block light of a predetermined wavelength, may partially block light of a first wavelength, etc.). In particular, the light blocking member 1400 may block UV. For example, the light blocking member 1400 may include an acrylic optical film including a material capable of blocking the UV.

The display panel according to example embodiments may include the reflective member 1370 having the first openings 1380 and the transparent member 1450 having the second openings 1470. Accordingly, the display panel may serve as a mirror display device having a color (e.g., a predetermined color, a first color, etc.). As the mirror display device has various colors, the display panel may have various applications. In addition, since the UV is blocked, deterioration of the light emitting structures included in the display panel may be decreased.

Figure 6:
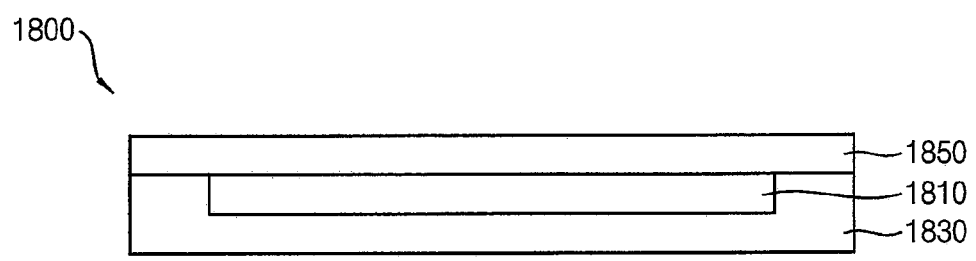
FIG. 6 is a cross-sectional view of an organic light emitting display device in accordance with example embodiments.

FIG. 6 is a cross-sectional view illustrating an organic light emitting display device in accordance with example embodiments of the present invention.

Referring to FIG. 6, an organic light emitting display (OLED) display device 1800 may include a display panel 1810, a body 1830, and a light blocking member 1850. The display panel 1810 may include a substrate including a plurality of pixel regions having sub-pixel regions and a reflective region surrounding the sub-pixel regions, light emitting structures disposed in the pixel regions on the substrate, an encapsulation substrate disposed over the light emitting structures, and a reflective member disposed on a lower surface of the encapsulation substrate, the reflective member including first openings, each first opening being located at a respective one of the sub-pixel regions.

The body 1830 may substantially surround the display panel 1810. The body 1830 may protect the display panel 1810 from external impact. For example, the body 1830 may include a synthetic resin or a metal (e.g., stainless steel, titanium (Ti), etc). The display panel 1810 may display a display image by the light emitting layers included in the light emitting structures. In addition, an image of an object that is located in front of the display panel 1810 may reflect in the reflective member included in the display panel 1810.

The light blocking member 1850 may be disposed on the display panel 1810 and the body 1830. The light blocking member 1850 may protect the display panel 1810. Light generated from the display panel 1810 may travel through the light blocking member 1850. In example embodiments, the light blocking member 1850 may include a tempered glass. For example, the light blocking member 1850 may include a glass or a transparent plastic.

The light blocking member 1850 may further include UV blocking materials, a pigment, a dye, etc. In example embodiments, when the tempered glass is formed, the UV blocking materials, the pigment, the dye, etc. may be added. Thus, the light blocking member 1850 may partially block light (e.g., may partially block light of a predetermined wavelength, may partially block light of a first wavelength, etc.). In example embodiments, the light blocking member 1850 may block UV, and may partially block visible light, for example, may partially block visible light of a first wavelength. The light blocking member 1850 may have a color determined by the pigments and/or the dyes (e.g., may have a predetermined color, may have a first color, etc.). For example, when a material blocking a yellow color light is selected, the light blocking member 1850 may have a yellow color. Here, the light blocking member 1850 may block the visible light of a wavelength range corresponding to the yellow color light. That is, the light blocking member 1850 may have various colors according to selected materials, and may block visible light, for example, may block visible light of a predetermined wavelength. Here, intensity of the light that is blocked by the light blocking member 1850 may be adjusted by controlling an amount of the materials (e.g., the pigments and the dyes). For example, when the amount of the light blocking materials is relatively increased, the intensity of the blocked light may be relatively increased in the light blocking member 1850. In similar, when the amount of the light blocking materials is relatively decreased, the intensity of the blocked light may be relatively decreased in the light blocking member 1850. That is, the amount of the materials may be proportional to the intensity of the blocked light. Here, when light emitted from the first and second light emitting layers included in the light emitting structures travels through the light blocking member 1850, at least a portion of the emitted light may be blocked according to the selected materials. In addition, after incident light is reflected from the reflective member, a color of the incident light that is passed through the light blocking member 1850 may be the same as a color of a blocked light. Thus, the light, which is passed through the light blocking member 1850 having a relatively decreased intensity, may be superposed with the incident light which is passed through the light blocking member 1850. In this case, the visibility of the OLED device 1800 may be improved by adjusting gamma values of the OLED device 1800 (e.g., adjusting a light emitting ratio of red, green, or blue)

The OLED device 1800 according to example embodiments may include the display panel 1810 having the reflective member and the light blocking member 1850. Accordingly, the OLED device 1800 may serve as a mirror display device having a color (e.g., a predetermined color). As the mirror display device has various colors, the OLED device 1800 may be used in various applications. In addition, since the UV is blocked, deterioration of the light emitting structures included in the OLED device 1800 may be decreased.

The present invention may be applied to various display devices including an organic light emitting display device. For example, the present invention may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims and their equivalents. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. A display panel, comprising:
   a substrate including a plurality of pixel regions having sub-pixel regions and a reflective region surrounding the sub-pixel regions;
   light emitting structures in the sub-pixel regions, the light emitting structures being on the substrate;
   an encapsulation substrate over the light emitting structures;
   a reflective member on a lower surface of the encapsulation substrate, the reflective member being located at the reflective region and having openings, each of the openings being located at a corresponding one of the sub-pixel regions; and
   a light blocking member on an upper surface of the encapsulation substrate, the light blocking member comprising:
      first portions located in the sub-pixel regions, each of the first portions blocking light of a second wavelength range; and
      a second portion located at the reflective region and blocking light of a predetermined wavelength range from among light of a first wavelength range such that the second portion has a first color, a lowermost wavelength of the first wavelength range being greater than an uppermost wavelength of the second wavelength range.

2. The display panel of claim 1, wherein the light blocking member blocks ultraviolet rays and blocks a portion of visible light.

3. The display panel of claim 1,
   wherein the second wavelength range is in a wavelength range of ultraviolet rays,
   wherein the first wavelength range is in a wavelength range of visible light,
   wherein each of the first portions of the light blocking member blocks ultraviolet rays, and
   wherein the second portion of the light blocking member blocks ultraviolet rays and a portion of visible light.

4. The display panel of claim 3, wherein the first portions each comprise a material that blocks ultraviolet rays, and
   wherein the second portion comprises at least one selected from a material, a pigment, or a dye that block ultraviolet rays.

5. The display panel of claim 3, wherein each of the first portions is transparent.

6. The display panel of claim 1, wherein the second wavelength range is in a wavelength range of ultraviolet rays,
   wherein the first wavelength range is in a wavelength range of visible light,
   wherein the first and second portions of the light blocking member block ultraviolet rays and a portion of visible light, and
   wherein the first and second portions have the first color.

7. The display panel of claim 6, wherein the first and second portions include at least one selected from a material, a pigment, or a dye that block ultraviolet rays.

8. The display panel of claim 1, wherein each of the light emitting structures comprises:
   at least one semiconductor element on the substrate;
   a lower electrode on the semiconductor element, the lower electrode electrically connected to the semiconductor element;
   a light emitting layer on the lower electrode; and
   an upper electrode on the light emitting layer.

9. A display panel comprising:
   a substrate including a plurality of pixel regions having sub-pixel regions and a reflective region surrounding the sub-pixel regions;
   light emitting structures in the sub-pixel regions, the light emitting structures being on the substrate;
   an encapsulation substrate over the light emitting structures;
   a reflective member on a lower surface of the encapsulation substrate, the reflective member including first openings, wherein each first opening is located at a corresponding one of the sub-pixel regions;
   a transparent member between the encapsulation substrate and the reflective member, the transparent member having a second opening that overlaps with the first opening; and
   a light blocking member on an upper surface of the encapsulation substrate, the light blocking member blocking ultraviolet rays,
   wherein the light blocking member is transparent, and
   wherein the transparent member has a first color.

10. The display panel of claim 9, wherein the first opening and the second opening have the same size.

11. An organic light emitting display device, comprising:
   a display panel comprising:
   a substrate including a plurality of pixel regions having sub-pixel regions and a reflective region surrounding the sub-pixel regions;
   light emitting structures in the sub-pixel regions, the light emitting structures being on the substrate;
   an encapsulation substrate over the light emitting structures;
   a reflective member on a lower surface of the encapsulation substrate, the reflective member being located at the reflective region and having openings, each of the openings being located at a corresponding one of the sub-pixel regions;
   a body surrounding the display panel; and
   a light blocking member on the display panel and the body, wherein the light blocking member protects the display panel, and wherein the light blocking member comprises:
      first portions located in the sub-pixel regions, each of the first portions blocking light in a wavelength range of ultraviolet rays such that each of the first portions of the light blocking member blocks ultraviolet rays; and
      a second portion located at the reflective region and blocking light of a predetermined wavelength range from among light of a first wavelength range in a wavelength range of visible light such that the second portion has a first color, the second portion of the light blocking member blocking ultraviolet rays and a portion of visible light.

12. The organic light emitting display device of claim 11, wherein the light blocking member comprises at least one selected from a material, a pigment, or a dye that block ultraviolet rays.

13. The organic light emitting display device of claim 11, wherein the light blocking member comprises a glass or a plastic.

* * * * *